United States Patent
Lan et al.

(10) Patent No.: US 7,033,949 B2
(45) Date of Patent: Apr. 25, 2006

(54) STRUCTURE AND MANUFACTURING METHOD FOR NITRIDE-BASED LIGHT-EMITTING DIODES

(75) Inventors: Wen-How Lan, Taoyuan (TW); Kuang-Neng Yang, Hsinchu Hsien (TW); Lung-Chien Chen, Hsin-Chuang (TW); Fen-Ren Chien, Yung-Ho (TW)

(73) Assignee: Formosa Epitaxy Incorporation, Taoyuan (TW)

( * ) Notice: Subject to any disclaimer, the term of this patent is extended or adjusted under 35 U.S.C. 154(b) by 214 days.

(21) Appl. No.: 10/748,558

(22) Filed: Dec. 29, 2003

(65) Prior Publication Data

US 2005/0148194 A1    Jul. 7, 2005

(51) Int. Cl.
*H01L 21/302* (2006.01)
(52) U.S. Cl. .................. 438/706; 438/604; 438/605; 438/710; 438/720
(58) Field of Classification Search ................ 438/706, 438/710, 712, 720, 604, 606, 605
See application file for complete search history.

(56) References Cited

U.S. PATENT DOCUMENTS

| | | | |
|---|---|---|---|
| 6,693,352 B1 * | 2/2004 | Huang et al. | 257/743 |
| 2003/0082860 A1 * | 5/2003 | Yoshida et al. | 438/184 |
| 2003/0136957 A1 * | 7/2003 | Tsuda et al. | 257/14 |

\* cited by examiner

*Primary Examiner*—Lan Vinh (57) ABSTRACT

A method for manufacturing a GaN-based light-emitting diode (LED) is provided with the following steps of: providing a substrate; forming a GaN semiconductor epitaxy layer on the substrate, the GaN semiconductor epitaxy layer further including an n-type GaN contact layer, a light-emitting layer and a p-type GaN contact layer; forming a digital penetration layer on the p-type GaN contact layer; using a multi-step dry etching method to etch the digital penetration layer, the p-type GaN contact layer, the light-emitting layer to form an n-metal forming area, etching terminating at the light-emitting layer; forming a first ohmic contact electrode on the digital penetration layer for a p-type ohmic contact layer and a second ohmic contact electrode on the n-metal forming area for an n-type ohmic contact layer; and finally, forming pads on both first and second ohmic contact electrodes.

11 Claims, 11 Drawing Sheets

STRUCTURE AND MANUFACTURING METHOD FOR NITRIDE-BASED LIGHT-EMITTING DIODES

FIELD OF THE INVENTION

The present invention relates to a structure and a manufacturing method for light-emitting diodes and, more particularly, to a structure and manufacturing method for GaN-based light-emitting diodes, or light-emitting diodes made of other material with wide band gap.

BACKGROUND OF THE INVENTION

Figure 1:
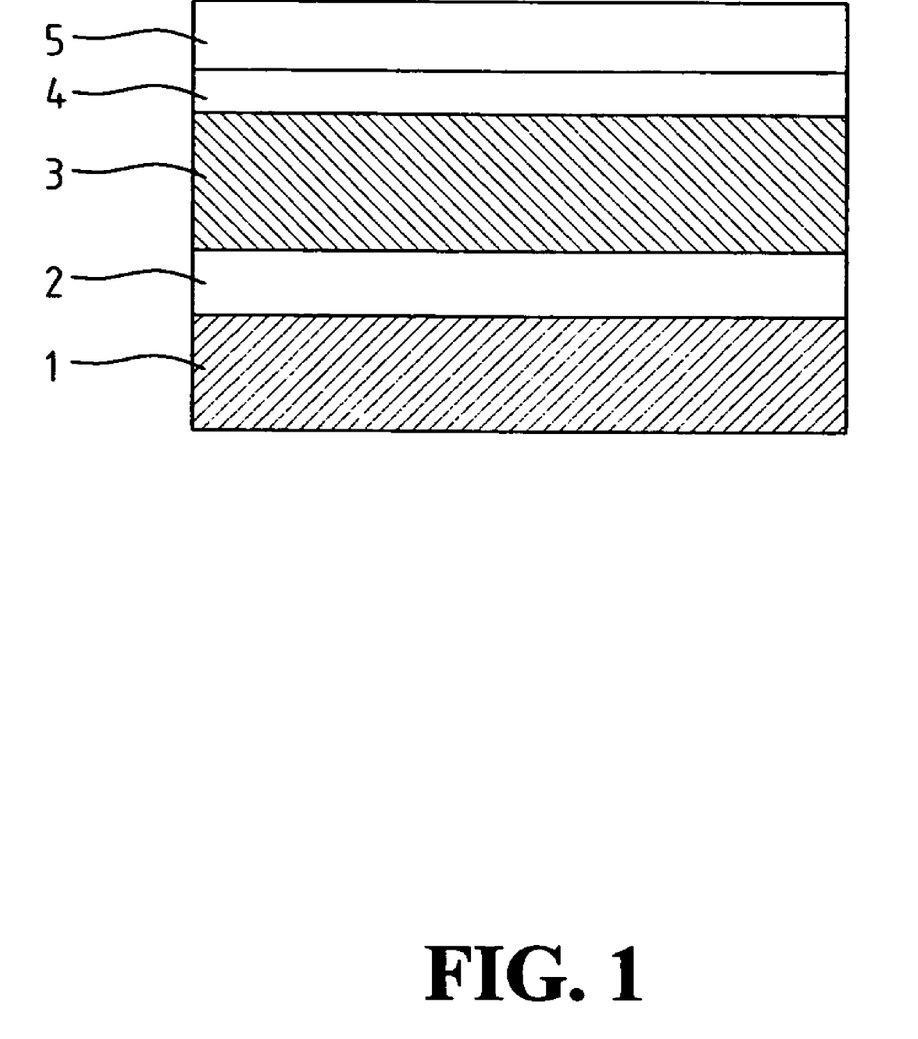
FIG. 1 shows a cross-sectional view of the structure of a conventional GaN-based light-emitting diode.
Figure 2A:
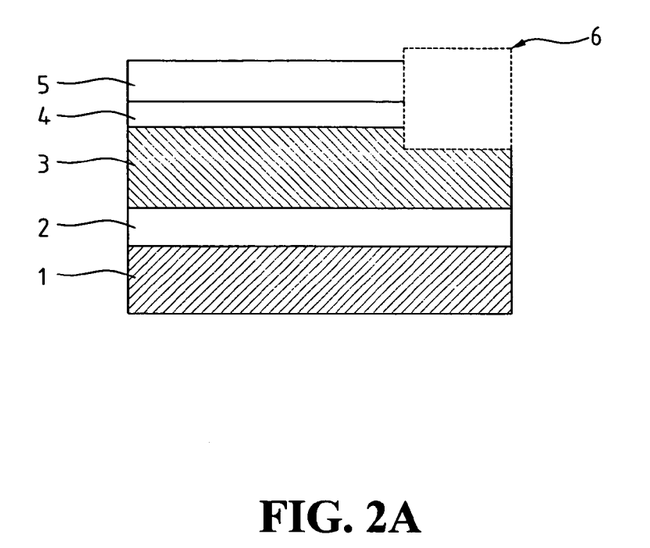
FIGS. 2A–2D show the manufacturing steps of a conventional GaN-based light-emitting diode of FIG. 1.
Figure 2B:
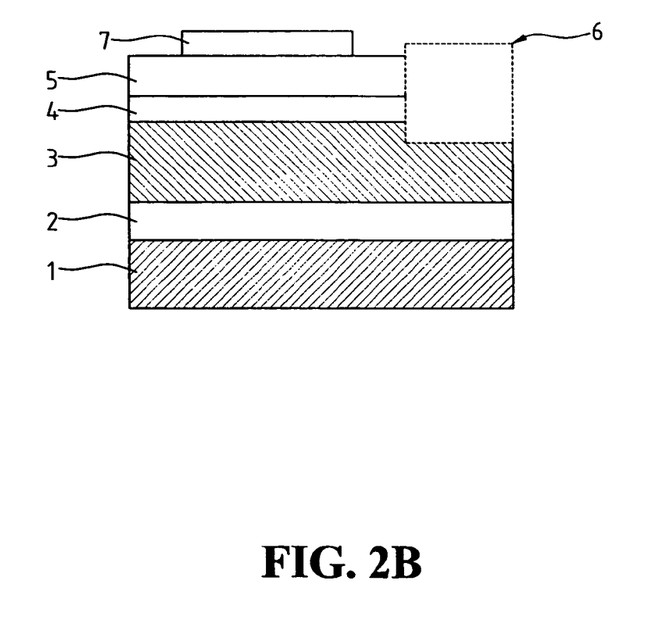
Figure 2C:
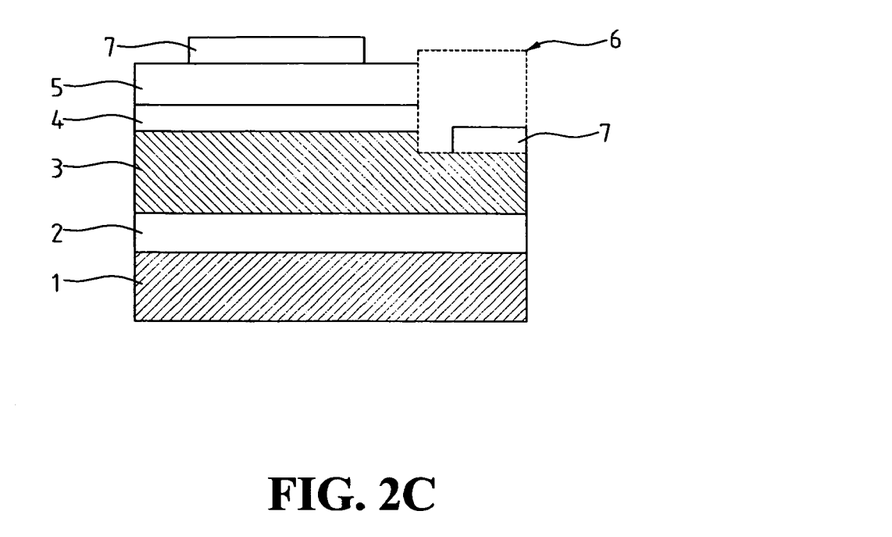
Figure 2D:
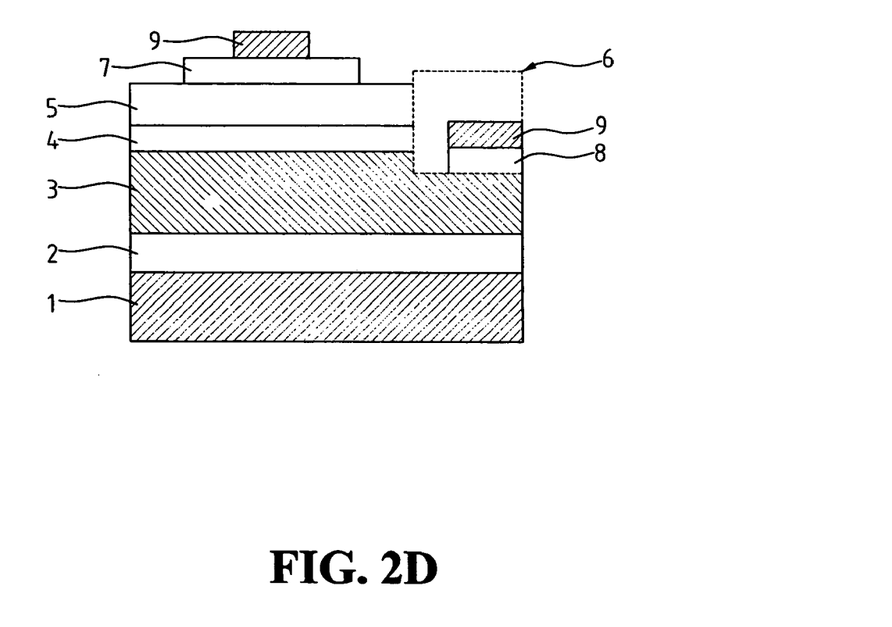

As shown in FIG. 1, the structure of a conventional GaN-based light-emitting diode includes a substrate 1, a buffer layer 2 grown on substrate 1, an n-type GaN layer 3 grown on buffer layer 2, a light-emitting layer 4 grown on n-type GaN layer 3, and a p-type GaN layer 5 grown on light-emitting layer 4. The light-emitting diode is manufactured with the following steps:

(1) Using the inductively coupled plasma-reactive ion etching (ICP-RIE) dry etching method to etch downward through p-type GaN layer 5, light-emitting layer 4, and reach n-type GaN layer 3 in order to form an n-metal forming area 6 of about 1 um deep, as shown in FIG. 2A;

(2) Forming a transparent and conductive first ohmic contact electrode 7 on p-type GaN layer 5, as shown in FIG. 2B;

(3) Forming a second ohmic contact electrode 8 on n-metal forming area 6, as shown in FIG. 2C; and (4) Forming pads 9 on both first ohmic contact electrode 7 and second ohmic contact electrode 8, as shown in FIG. 2D.

Thus, a conventional GaN-based light-emitting diode is manufactured.

In the aforementioned conventional method, a transparent conductive layer 7 is made of Ni/Au, which has a low optical transmittancy. Therefore, the external quantum efficiency of the manufactured light-emitting diodes is poor.

SUMMARY OF THE INVENTION

The present invention is to provide a structure and manufacturing method for reducing the contact impedance of the ohmic contacts of the GaN-based light-emitting diodes with a digital penetration layer and an Indium Tin Oxide (ITO) layer. To achieve this, the present invention utilizes the ITO layer on the digital penetration layer to form a low-impedance, transparent, and conductive ohmic contact layer. Because the ITO has a high optical transmittancy (>90%), the external quantum efficiency can be greatly improved. The n-metal forming area is formed on the light-emitting layer to reduce the operating voltage. Furthermore, the structure of the present invention having a p/n-metal pitch, which is about 0.2 μm, is good for flip-chip packaging and improving the external quantum efficiency.

These and other objects, features and advantages of the invention will be apparent to those skilled in the art, from a reading of the following brief description of the drawings, the detailed description of the preferred embodiment, and the appended claims.

DETAILED DESCRIPTION OF THE PREFERRED EMBODIMENTS

[First Embodiment]

Figure 3:
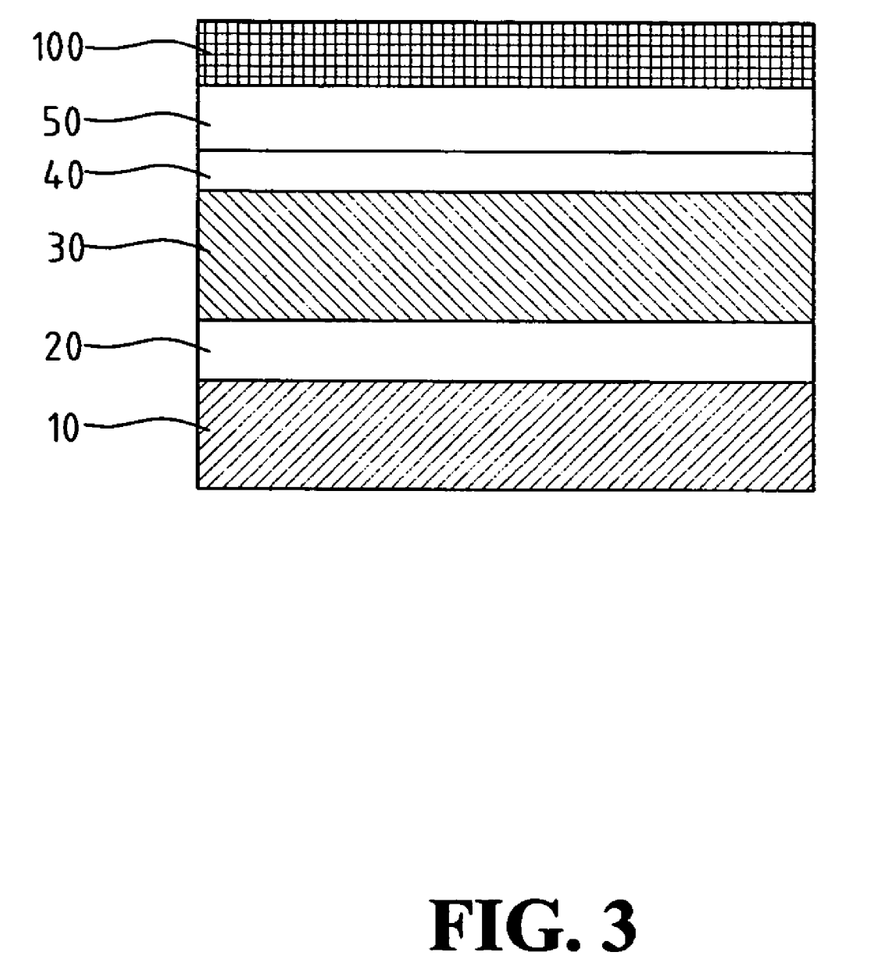
FIG. 3 shows a first preferred embodiment of the present invention.
Figure 4:
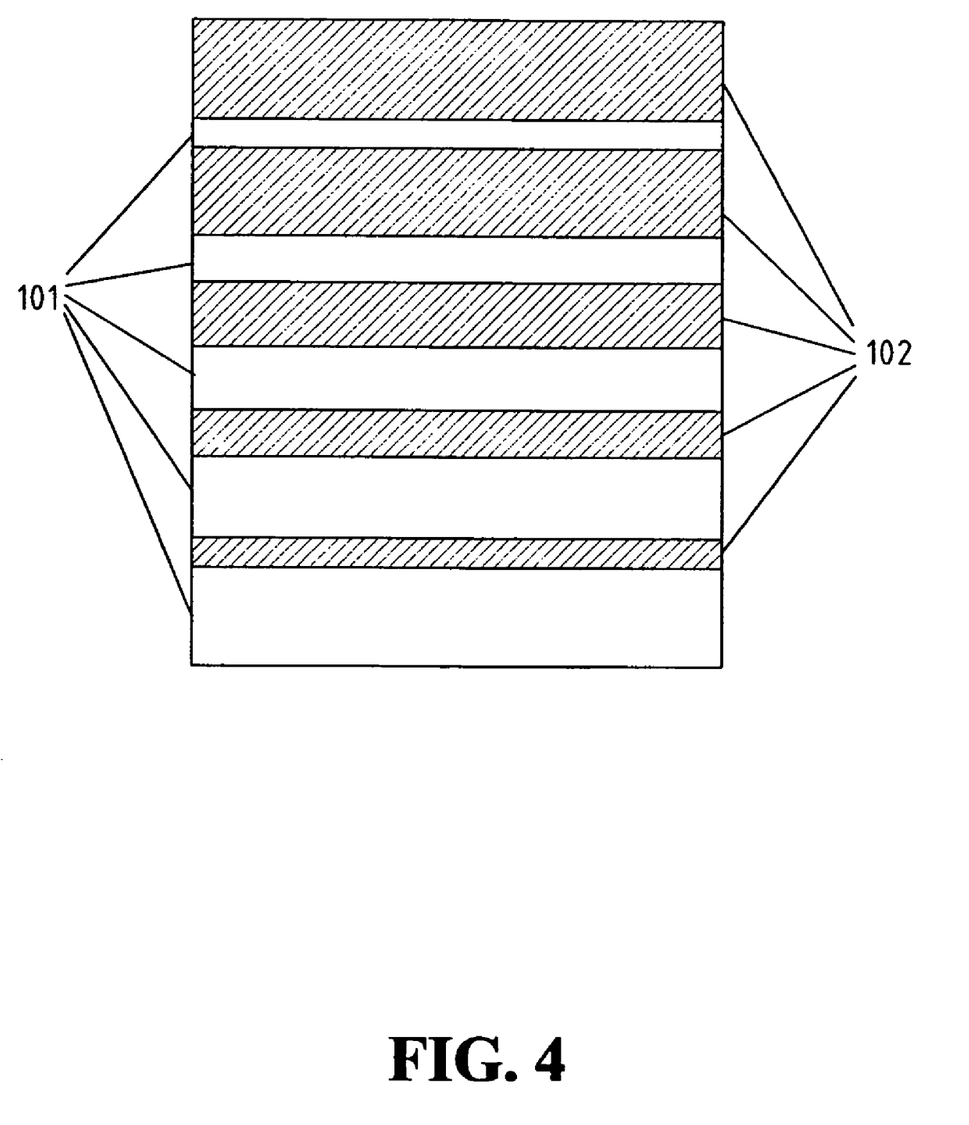
FIG. 4 shows a cross-sectional view of the digital penetration layer of the present invention.

As shown in FIG. 3, a substrate 10 is provided, and a buffer layer 20 is formed on substrate 10 using metal organic chemical vapor deposition (MOCVD), molecular beam epitaxy (MBE), or liquid phase epitaxy (LPE). The present invention uses the MOCVD method. The same MOCVD method is used to form an n-type GaN layer 30 on top of buffer layer 20, an light-emitting layer 40 on top of n-type GaN layer 30, a p-type GaN layer 50 on top of light-emitting layer 40, and a digital penetration layer 100 on top of p-type GaN layer 50. FIG. 4 shows the cross-sectional view of digital penetration layer 100. Digital penetration layer 100 is made of $Al_xIn_yGa_{1-x-y}N_zP_{1-z}$ and $Al_pIn_qGa_{1-p-q}N_rP_{1-r}$ with increasing (10 Å–90 Å) and decreasing (90 Å–10 Å) thickness, respectively, where $0<x,y,z,p,q,r<1$. The conductivity type of the digital penetration layer 100 can be p-type, n-type or I-type. When the light-emitting layer emits light with wavelength between 380 nm and 560 nm, the optical transmittancy of the digital penetration layer is greater than 80%

Figure 5A:
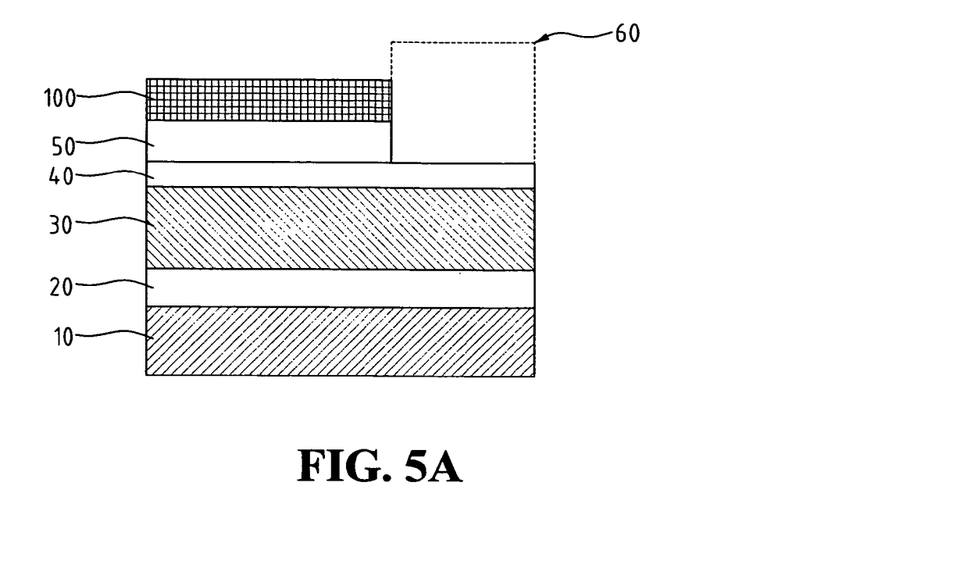
FIGS. 5A–5D show the manufacturing method for the first preferred embodiment of the present invention of a GaN-based light-emitting diode.

A single etching step of a multi-step dry etching method is used to etch digital penetration layer 100, p-type GaN layer 50, and light-emitting layer 40. The etching terminates at light-emitting layer 40. At the end of the etching, an n-metal forming area 60 is formed. The present invention uses a dry etching method of ICP-RIE, as shown in FIG. 5A.

Figure 5B:
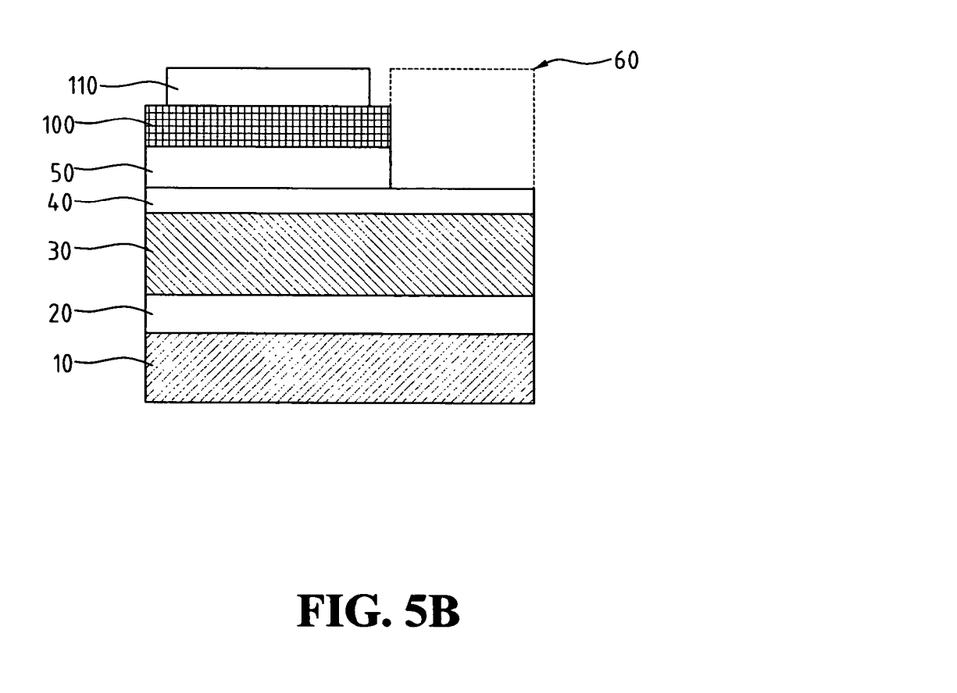

An ITO layer 110 is formed on top of digital penetration layer 100 using e-gun vaporation, sputtering, or thermal-resistance evaporation. The present invention uses sputtering deposition. As shown in FIG. 5B, ITO layer 110 formed with the sputtering deposition method can have the thickness of 100 Å–20000 Å, while the preferred thickness of the present invention is 1000 Å–4000 Å.

ITO layer 110 formed on top of digital penetration layer 100 is used as the first ohmic contact electrode because it is a p-type ohmic contact and with high optical transmittancy to improve the external quantum efficiency. An n-type ohmic contact layer is formed with the one of the aforementioned methods in the n-metal forming area 60 to be used as a second ohmic contact electrode 80. Because the ICP-RIE etching terminates at the light-emitting layer, there will be imperfection, which absorbs the free carriers and reduces the equivalent surface density. In addition, due to the surface vacant area, there is no carrier between the p/n junction area in spite of the existence of InGaN tunnel. On the other hand, n-metal forming area 60 is electroplated with a layer of Ti/Al. Because InGaN forms with Ti/Al an ohmic contact, which has a lower ohmic contact impedance than that of an ohmic contact formed by N—GaN with Ti/Al, a low-impedance ohmic contact is formed with the aid of the aforementioned imperfection. Also, because the dry etching does not etch as deep as conventional GaN-based light-emitting diodes, the lateral impedance is smaller and the operating voltage can be reduced.

Figure 5C:
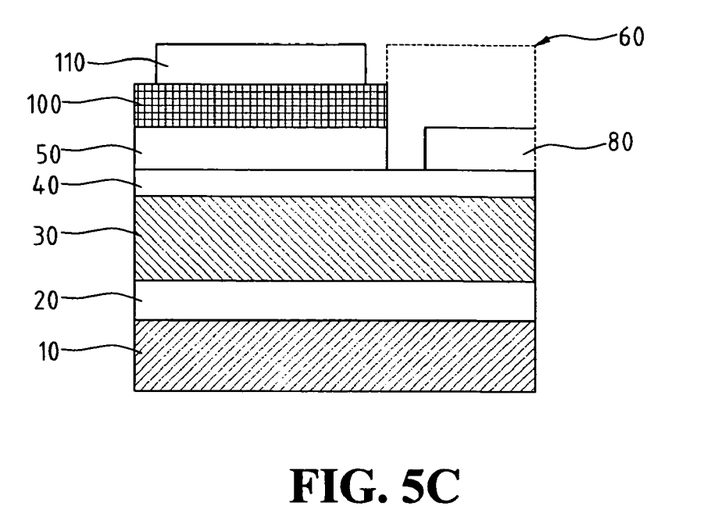

The present invention uses e-gun evaporation deposition to form n-type ohmic contact layer 80, with the material of Ti, Al, Au, Ni, In, Sn, Zn, Cr, Cu, W, Pt, Pd, ITO, Indium Oxide, Tin Oxide, or Aluminum Zinc Oxide, as shown in FIG. 5C.

Figure 5D:
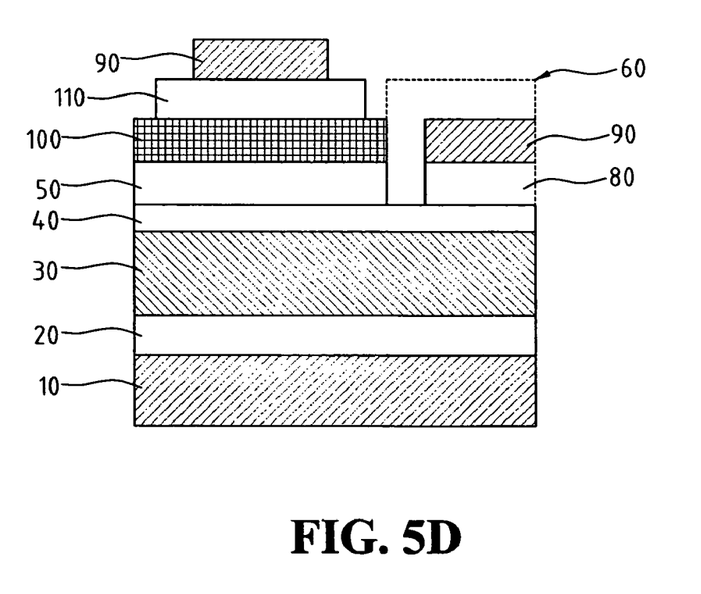

Finally, contact pads 90 are formed on ITO layer 110 and second ohmic contact electrode 80 using one of the aforementioned methods. The present invention uses e-gun evaporation deposition. Contact pads 90 are made of Ti, Al, Au, Cr, Ni, Pt, or their combination, as shown in FIG. 5D.

Figure 7:
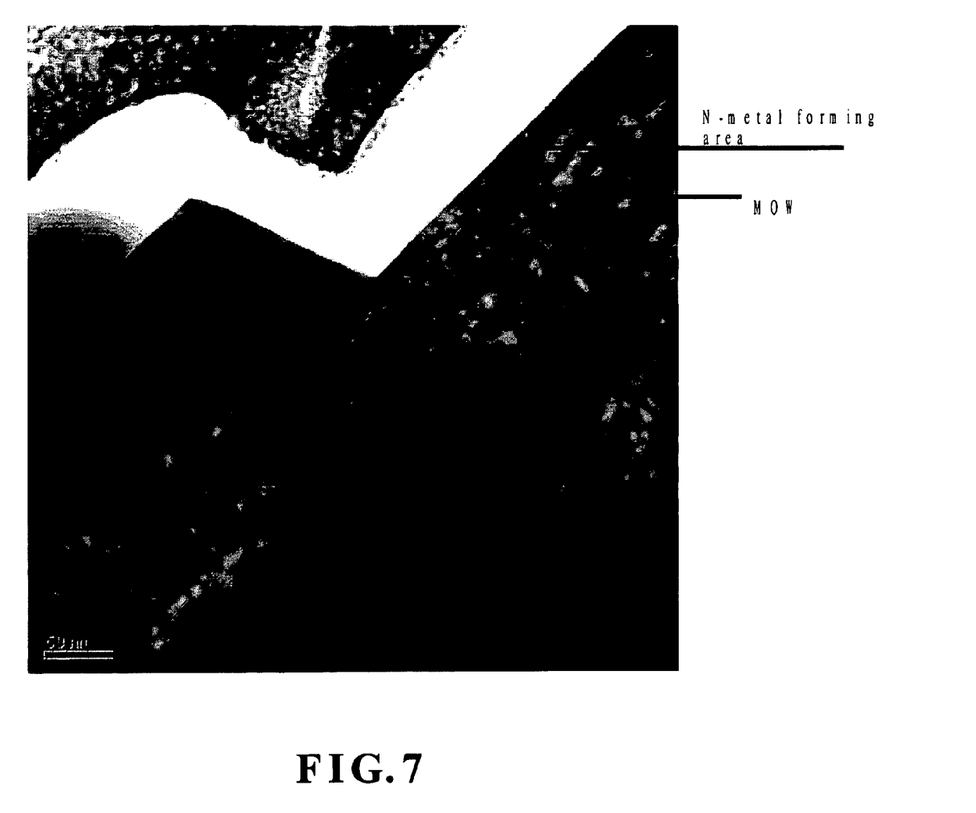
FIG. 7 shows a TEM image of the n-metal forming area on top of the light-emitting layer.

FIG. 7 shows the TEM image of n-metal forming area 60 formed on light-emitting layer 40 with a dry etching method.

Figure 8:
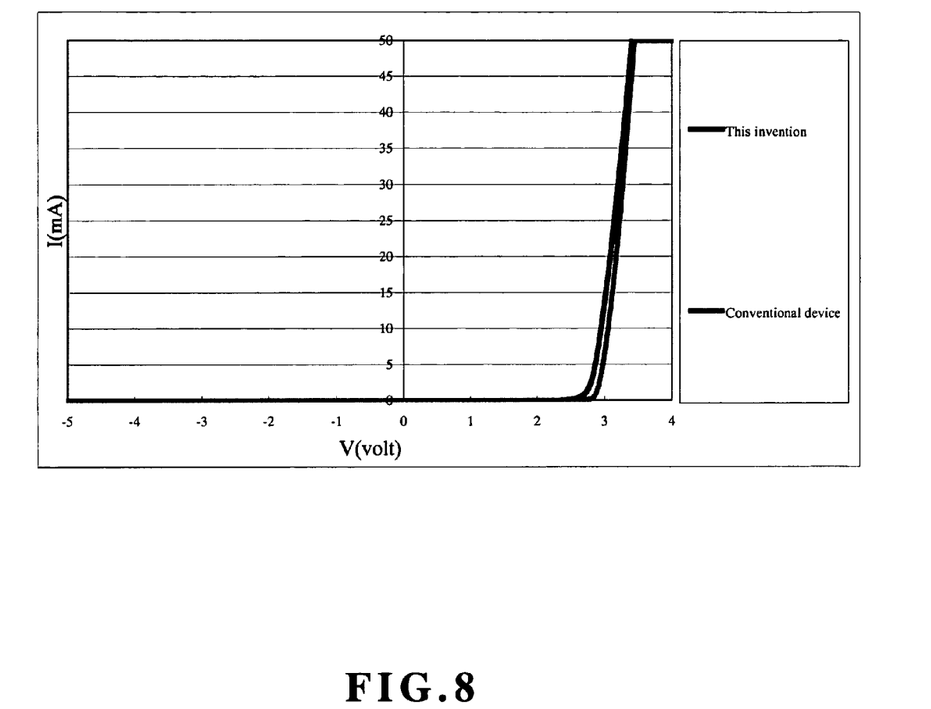
FIG. 8 shows the current-voltage relationship diagram of a conventional light-emitting diode and the present invention.

FIG. 8 shows the current-voltage relationship diagram of a conventional GaN-based light-emitting diode and the present invention. With a 100% test on the 2"-diameter wafers manufactured with a conventional method and the present invention, the former shows an average forward bias of 3.17V and yield rate is 97.95% when the input current is 20 mA, while the latter shows an average forward bias of 3.12V and yield rate is 98.17%. The former has the yield rate of 87.68% when the leakage current is less than 1 mA at −5V, while the latter has the yield rate of 92.81%. The results show that the present invention has superior electrical characteristics to a conventional GaN-based light-emitting diode.

[Second Embodiment]

Figure 6A:
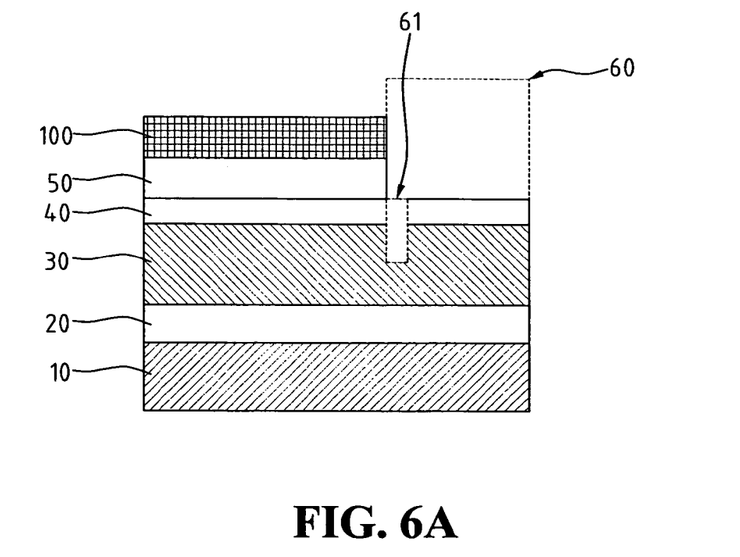
FIGS. 6A–6D show the manufacturing method for the second preferred embodiment of the present invention of a GaN-based light-emitting diode.

As shown in FIG. 6A, a substrate 10 is provided, and a buffer layer 20 is formed on substrate 10 using metal organic chemical vapor deposition (MOCVD), molecular beam epitaxy (MBE), or liquid phase epitaxy (LPE). The present invention uses the MOCVD method. The same MOCVD method is used to form an n-type GaN layer 30 on top of buffer layer 20, an light-emitting layer 40 on top of n-type GaN layer 30, a p-type GaN layer 50 on top of light-emitting layer 40, and a digital penetration layer 100 on top of p-type GaN layer 50.

Figure 6B:
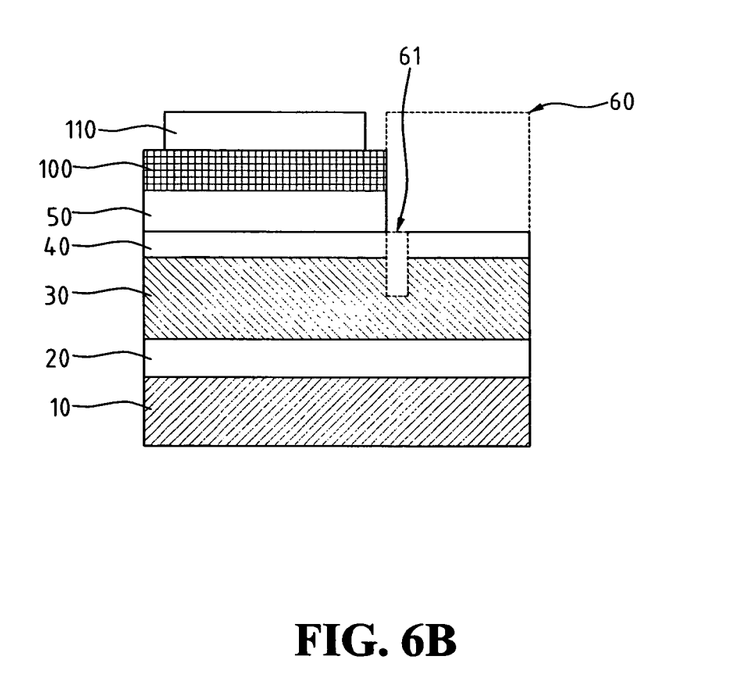

A two-step dry etching method of a multi-step dry etching method is then used to etch downward. The first step etching etches downward digital penetration layer 100, p-type GaN layer 50, and light-emitting layer 40. The etching terminates at light-emitting layer 40. At the end of the etching, an n-metal forming area 60 is formed. The second step etching etches downward part of n-metal forming area 60, light-emitting layer 40, and n-type GaN layer 30 to form a trench 61. The width of the trench 61 is approximately 0.2 mm. The present invention uses a dry etching method of ICP-RIE. An ITO layer 110 is formed on top of digital penetration layer 100 using e-gun vaporation, sputtering, or thermal-resistance evaporation. ITO layer 110 formed on top of digital penetration layer 100 is used as the first ohmic contact electrode because it is a p-type ohmic contact and with high optical transmittaney. The present invention uses sputtering deposition. As shown in FIG. 6B, ITO layer 110 formed with the sputtering deposition method can have the thickness of 100 Å–20000 Å, while the preferred thickness of the present invention is 1000 Å–4000 Å.

Figure 6C:
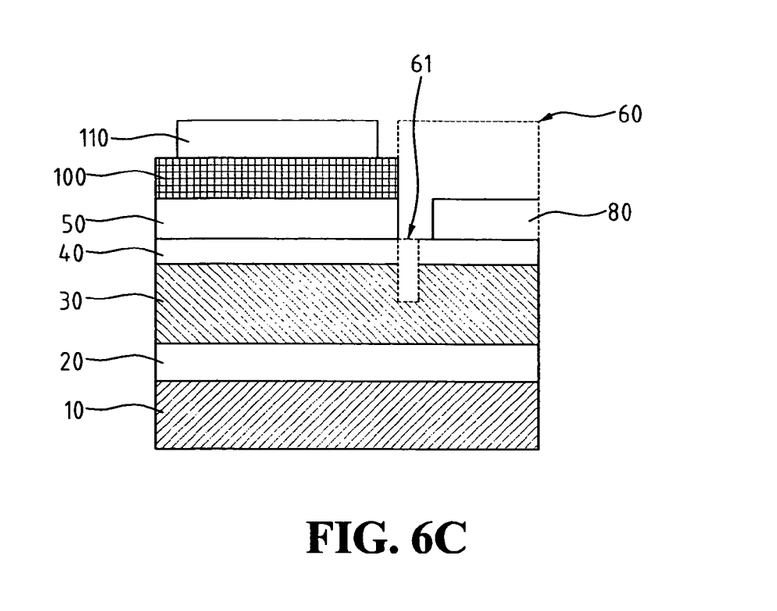

An n-type ohmic contact layer is formed with the one of the aforementioned methods in the n-metal forming area 60 to be used as a second ohmic contact electrode 80. The present invention uses e-gun evaporation deposition to form n-type ohmic contact layer 80, with the material of Ti, Al, Au, Ni, In, Sn, Zn, Cr, Cu, W, Pt, Pd, ITO, Indium Oxide, Tin Oxide, or Aluminum Zinc Oxide, as shown in FIG. 6C.

Figure 6D:
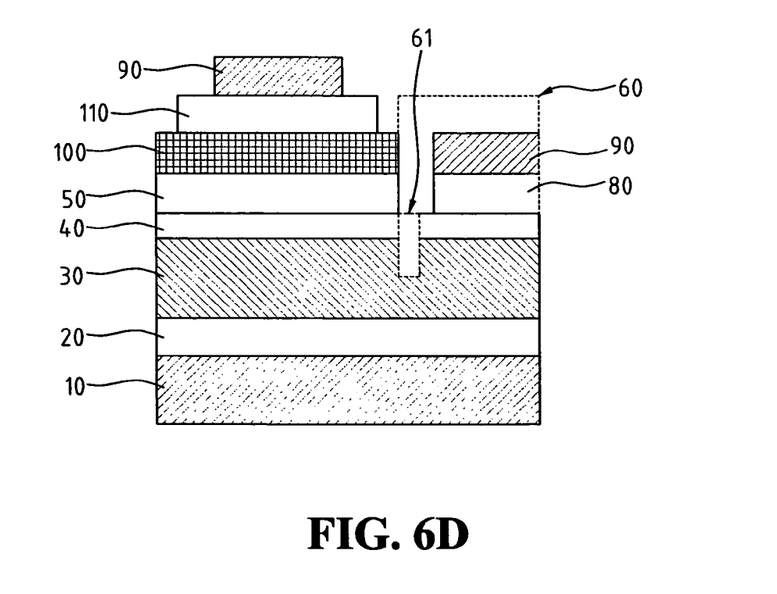

Finally, contact pads 90 are formed on ITO layer 110 and second ohmic contact electrode 80 using one of the aforementioned methods. The present invention uses e-gun evaporation deposition. Contact pads 90 are made of Ti, Al, Au, Cr, Ni, Pt, or their combination, as shown in FIG. 6D.

While the invention has been described in connection with what is presently considered to the most practical and preferred embodiment, it is to be understood that the invention is not to be limited to the disclosed embodiment, but, on the contrary, it should be clear to those skilled in the art that the description of the embodiment is intended to cover various modifications and equivalent arrangement included within the spirit and scope of the appended claims.

What is claimed is:

1. A method for manufacturing a GaN-based light-emitting diode (LED), comprising the steps of:
    providing a substrate;
    forming a GaN semiconductor epitaxy layer on said substrate, said GaN semiconductor epitaxy layer further comprising an n-type GaN contact layer, a light-emitting layer and a p-type GaN contact layer, said light-emitting layer being a light-emitting source;
    forming a digital penetration layer on said p-type GaN contact layer, said digital penetration layer having functions of a p-type ohmic contact layer and high transmittancy with respect to light emitted by said light-emitting layer;
    etching said digital penetration layer, said p-type GaN contact layer, and said light-emitting layer to form an n-metal forming area and expose a portion of said light-emitting layer as an n-type ohmic contact layer;
    etching said light-emitting layer and said n-type GaN contact layer to form a trench in said n-metal forming area for separating a p/n junction area;
    forming a first ohmic contact electrode on said digital penetration layer for said p-type ohmic contact layer;
    forming a second ohmic contact electrode on said n-metal forming area for said n-type ohmic contact layer; and
    forming pads on both said first ohmic contact electrode and said second ohmic contact electrode.

2. The method as claimed in claim 1, wherein said digital penetration layer is formed with one of the following methods: metal organic chemical vapor deposition (MOCVD), molecular beam epitaxy (MBE), and liquid phase epitaxy (LPE).

3. The method as claimed in claim 1, wherein said digital penetration layer is made of $Al_xIn_yGa_{1-x-y}N_zP_{1-z}$ and $Al_qIn_pGa_{1-p-q}N_rP_{1-r}$ with increasing (10 Å–90 Å) and decreasing (90 Å–10 Å) thickness, respectively, where $0<x,y,z,p,q,r<1$, and conductivity type of said digital penetration layer can be either p-type, n-type, or I-type.

4. The method as claimed in claim 1, wherein said light-emitting layer emits light with wavelength between 380 nm and 560 nm, and the optical transmittancy of said digital penetration layer with respect to said wavelength is greater than 80%.

5. The method as claimed in claim 1, wherein said first ohmic contact electrode is made of Indium Tin Oxide (ITO).

6. The method as claimed in claim 1, wherein said first ohmic contact electrode has thickness between 1000 Å–4000 Å.

7. The method as claimed in claim 1, wherein the distance between said first ohmic contact electrode and said substrate is greater than the distance between said second ohmic contact electrode and said substrate.

8. The method as claimed in claim 1, wherein said second ohmic contact electrode is made of one or a combination of materials selected from the group consisting of Ti, Al, Au, Ni, In, Sn, Zn, Cr, Cu, W, Pt, Pd, ITO, Indium Oxide, Tin Oxide, and Aluminum Zinc Oxide.

9. The method as claimed in claim 1, wherein each of said pads is made of one or a combination of materials selected from the group consisting of Ti, Al, Au, Cr, Ni, and Pt.

10. The method as claimed in claim 1, wherein said n-metal forming area has depth between 1000 Å–3000 Å.

11. The method as claimed in claim 1, wherein said trench is approximately 0.2 mm wide.

* * * * *